United States Patent
Duparre et al.

(10) Patent No.: US 8,610,815 B2
(45) Date of Patent: Dec. 17, 2013

(54) IMAGING DEVICE HAVING MICROLENS ARRAY ADHERED TO WAFER-LEVEL LENS

(75) Inventors: Jacques Duparre, Jena (DE); Ulrich C. Boettiger, Boise, ID (US)

(73) Assignee: Aptina Imaging Corporation, George Town (KY)

(*) Notice: Subject to any disclaimer, the term of this patent is extended or adjusted under 35 U.S.C. 154(b) by 384 days.

(21) Appl. No.: 12/352,479

(22) Filed: Jan. 12, 2009

(65) Prior Publication Data
US 2010/0177235 A1   Jul. 15, 2010

(51) Int. Cl.
*G03B 13/00* (2006.01)
*H04N 5/232* (2006.01)

(52) U.S. Cl.
USPC .................... 348/345; 348/335; 348/336

(58) Field of Classification Search
USPC .................. 348/345, 335, 336
See application file for complete search history.

(56) References Cited

U.S. PATENT DOCUMENTS

| | | | |
|---|---|---|---|
| 6,171,885 B1 | 1/2001 | Fan et al. | |
| 6,362,498 B2 | 3/2002 | Abramovich | |
| 6,654,173 B1 | 11/2003 | Uozu et al. | |
| 6,808,960 B2 | 10/2004 | Yamamoto | |
| 7,083,999 B2* | 8/2006 | Hashimoto | 438/60 |
| 7,144,745 B2 | 12/2006 | Badehi | |
| 7,365,298 B2 | 4/2008 | Ryu | |
| 7,443,005 B2* | 10/2008 | Kuo et al. | 257/432 |
| 7,453,509 B2* | 11/2008 | Losehand et al. | 348/340 |
| 7,656,453 B2* | 2/2010 | Nishi | 348/340 |
| 7,688,531 B1* | 3/2010 | Deng et al. | 359/811 |
| 2001/0042876 A1* | 11/2001 | Wester | 257/292 |
| 2003/0076286 A1* | 4/2003 | Luo et al. | 345/87 |
| 2003/0123779 A1* | 7/2003 | Hashimoto | 385/14 |
| 2003/0127647 A1* | 7/2003 | Street et al. | 257/59 |
| 2004/0095502 A1* | 5/2004 | Losehand et al. | 348/340 |
| 2005/0045805 A1* | 3/2005 | Sakoh et al. | 250/208.1 |
| 2006/0073630 A1 | 4/2006 | Liu | |
| 2007/0117349 A1* | 5/2007 | Komatsu et al. | 438/459 |
| 2008/0042227 A1* | 2/2008 | Asano et al. | 257/432 |
| 2008/0043182 A1* | 2/2008 | Luo et al. | 349/113 |
| 2008/0135962 A1* | 6/2008 | Ryu | 257/432 |
| 2009/0200452 A1* | 8/2009 | Venezia et al. | 250/208.1 |
| 2009/0278220 A1* | 11/2009 | Kim | 257/432 |
| 2010/0002302 A1* | 1/2010 | Duparre et al. | 359/571 |
| 2010/0177235 A1* | 7/2010 | Duparre et al. | 348/345 |

OTHER PUBLICATIONS

Norland Products, Norland Optical Adhesive 83H, Nov. 9, 2005; (http://web.archive.org/web/20051109135328/http://www.norlandprod.com/adhesives/noa%2083h.html).*

* cited by examiner

*Primary Examiner* — Antoinette Spinks
(74) *Attorney, Agent, or Firm* — Kendall P. Woodruff (57) ABSTRACT

Methods and apparatuses having imaging structures that include a focusing lens structure, a pixel array, and a transparent material arranged between the focusing lens and the pixel array. A color filter array may be located between the transparent material and the pixels of the pixel array.

19 Claims, 8 Drawing Sheets

IMAGING DEVICE HAVING MICROLENS ARRAY ADHERED TO WAFER-LEVEL LENS

FIELD OF THE INVENTION

Embodiments of the invention relate generally to imaging devices, and more particularly, to maintaining the angle of refraction of light as the light moves through a substrate to a microlens.

BACKGROUND

Solid state imaging devices, e.g., CCD, CMOS, and others, may include a wafer-level lens or series of wafer-level lenses to direct incoming light onto a focal plane array of pixels. Each one of the pixels includes a photosensor, for example, a photogate, photoconductor, or photodiode, overlying a substrate for accumulating photo-generated charge in an underlying portion of the substrate. The charge generated by the pixels in the pixel array is then read out and processed to form an image.

Figure 1:
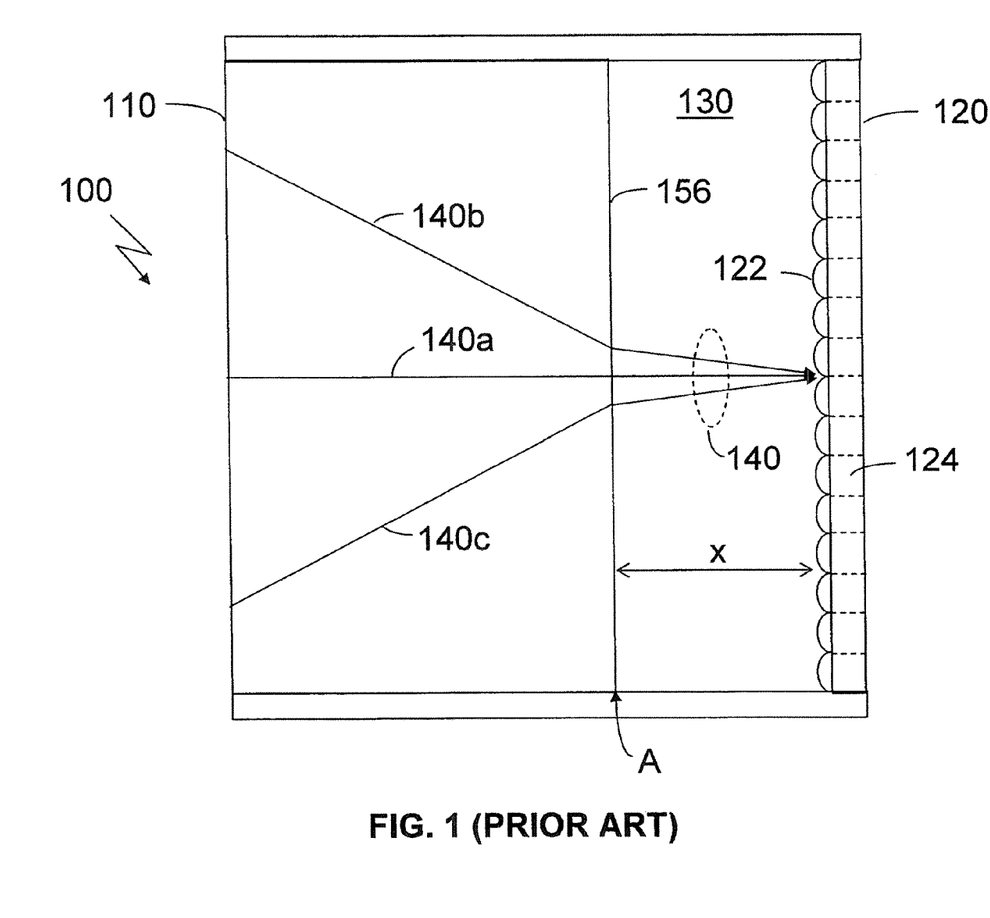
FIG. 1 shows an imager module and a bundle of light rays having a chief ray angle of zero degrees.

FIG. 1 is a diagram of a portion of an imager module 100 having a wafer-level focusing lens structure attached to a substrate 110 and a pixel array 120, the latter of which is part of an imager die. It should be understood that the focusing lens may be a simple or compound lens of varying shape and that only the substrate 110 on which the lens sits is shown in FIG. 1. One end of the substrate 110 is spaced at a distance x from the pixel array 120. The pixel array 120 includes a plurality of microlenses 122, arranged above a respective pixel cell 124, that focus incoming light onto the photosensor of the respective pixel cells 124.

Conventional imager modules 100, such as the one in FIG. 1, include a gap 130 between the illustrated end of the substrate 110 and the pixel array 120 that is filled with air. The index of refraction of air ($n_{air}=1$) is lower than the index of refraction of the substrate 110, which may be made of glass. The gap 130 and the difference in the indexes of refraction in a conventional imaging device cause the light rays 140a, 140b, 140c to be refracted at the interface (shown by arrow A) between the substrate 110 and the air gap 130.

Light rays 140a, 140b, 140c are generally focused by the focusing lens structure into a conical bundle of light rays 140. The light ray 140a in the center of the bundle of light rays 140 is known as the chief ray and the angle of the chief ray is known as the chief ray angle. The chief ray angle is measured in relation to the normal of the planar surface 156 of the image sensor 120, with an angle of zero degrees being perpendicular to the planar surface 156. The materials, shapes, and distance x from the pixel array 120 of a focusing lens structure are generally selected to optimally focus the bundle of light 140 having its chief ray angle 140a at zero degrees.

Figure 2:
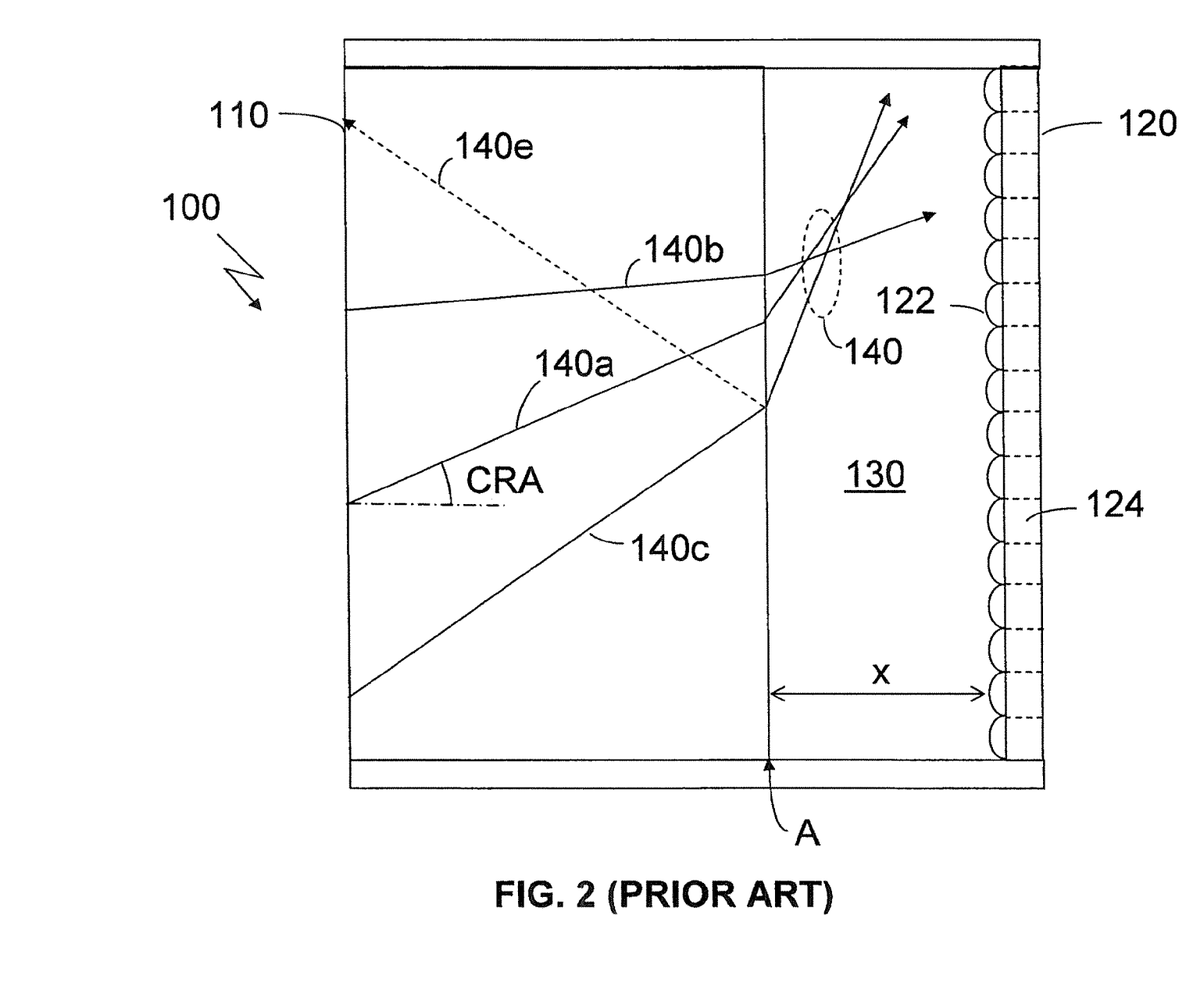
FIG. 2 shows an imager module and a bundle of light rays having an oblique chief ray angle.

However, as shown in FIG. 2, if light rays 140 enter the imager module 100 and pass through the substrate 110 at a chief ray angle that is sufficiently oblique or acute, light rays 140a, 140b, 140c exiting the substrate 110 at the interface between the substrate 110 and the air gap 130 will be refracted outwards due to the difference between the index of refraction of the air gap 130 and the index of refraction of the substrate 110 so that the light rays 140a, 140b, 140c may miss the pixel array 120 entirely, are not focused properly, or enter the image sensor at a too large angle. In some instances, light rays may be partially or totally internally reflected as represented by light ray 140e. The loss of light and poor focusability of light rays 140 having a high chief ray angle will negatively affect the quality of an image generated by the pixel array 120.

What is needed is a system and method by which light rays having a high chief ray angle are not refracted away from a pixel array of an imaging device at the transition from the lens to the pixel array.

DETAILED DESCRIPTION

In the following detailed description, reference is made to the accompanying drawings which form a part hereof, and in which are shown by way of illustration specific embodiments that may be practiced. These embodiments are described in sufficient detail to enable those of ordinary skill in the art to make and use them, and it is to be understood that structural, logical, or procedural changes may be made to the specific embodiments disclosed herein.

Embodiments of imager modules described herein include a transparent material arranged between a focusing lens structure and a pixel array that has an index of refraction that is close to or the same as the index of refraction of a portion of the focusing lens adjacent to the transparent material. Due to the similarity of the index of refraction of the focusing lens structure and the transparent material, light rays do not bend further outwards at the interface between the focusing lens structure and the transparent material as they would if the transparent material had a lower refractive index. Therefore, light bundles having a much higher chief ray angle are transmitted to the pixel array without being bent further outwards. Increased image quality and decreased optical cross-talk between pixels may thus be achieved.

Figure 3:
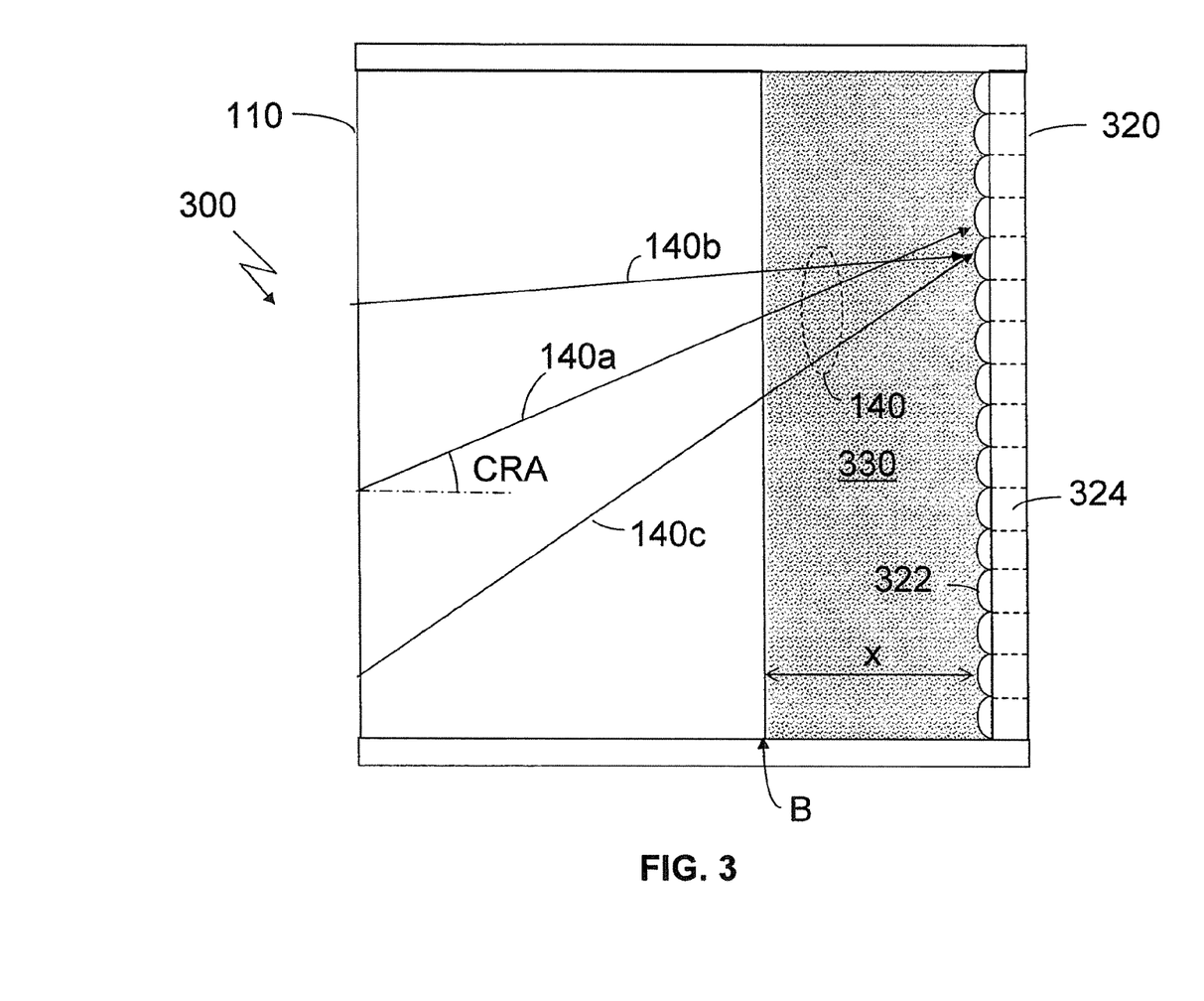
FIG. 3 shows an example imager module and a bundle of light rays according to an embodiment described herein.

FIG. 3 is a diagram of a portion of an imager module 300 having a focusing lens structure including a substrate 110 and a pixel array 320, which is part of an imager die. It should be understood that although a substrate 110 is shown in the following embodiments, the substrate 110 is merely one example of an element that may be included in a focusing lens structure that may include multiple elements including multiple substrates and compound lenses. In various embodiments, the substrate 110 may be replaced with a lens, a portion of a lens, or other transparent elements. One end of the substrate 110 is spaced at a distance x from the pixel array 320. The pixel array 320 includes a plurality of convex microlenses 322 arranged above respective pixel cells 324 that focus incoming light onto the photosensor of the respective pixel cell 324. The imager module 300 also includes a transparent material 330 arranged between one end of the substrate 110 and the microlenses 322 of the pixel array 320.

The transparent material 330 has an index of refraction that is close to or the same as the index of refraction of the substrate 110. In one embodiment, the difference between the indexes of refraction of the substrate 110 and the transparent material 330 may be 20% or less, 10% or less, or less than 5%.

The transparent material 330 may be, for example, an adhesive and may bind the lens 110 to the microlenses 322. The substrate 110 may be formed of glass or polymer and may have an index of refraction at or approximately at 1.5, while the transparent material 330 may be a material that also has an index of refraction at or approximately at 1.5. In one embodiment, the transparent material may have an index of refraction between about 1.38 to 1.45.

Examples of transparent materials 330 that may be used include ultraviolet curable material TU-7048 from JSR Corporation, thermal curable material TT8021 from JSR Corporation, Adhesives N61, N63, and N68 from Norland Products, Inc., Vitralit® from Panacol-Elosol GmbH, OPA-20632 from Dymax Corporation, Adhesive 3471-2-136 from DSM Desotech, Inc., Zipcone UA from Gelest, Inc., Adhesive OG134 by Epo-Tek, and Ormocers, e.g., Ormocomp, from Micro Resist Technology, GmbH.

As shown in FIG. 3, because the transparent material 330 and the substrate 110 have a similar or same index of refraction, light rays 140a, 140b, 140c will not be refracted at the substrate 110 and transparent material 330 interface B. Therefore, light bundles 140 having a high chief ray angle are transmitted to the pixel array without being bent further outwards where they cannot be detected by the pixel array 320 or are defocused.

The microlenses 322 of FIG. 3 are convex lenses and have a higher index of refraction than that of the transparent material 330 in order to focus the incoming light 140 onto the photosensors and enhance the fill factor of the pixel cells 324. The microlenses may have an index of refraction between about 1.7 to 2.4. The microlenses 322 may be formed of materials such as silicon nitride, silicon oxynitrides, carbon (diamond), and titanium oxide based materials. In one embodiment, the microlens material may be shaped into lenses by depositing a base film of the desired material and etching a polymeric microlens into the film by dry etching.

In one embodiment, the difference in the index of refraction of the transparent material 330 and the index of refraction of the microlenses 322 may be between about 0.25 to about 1. In another embodiment, the index of refraction may be about 0.5. In one embodiment, the index of refraction of the transparent material 330 may be at or about 1.5 and the index of refraction of the microlenses 322 may be at or about 2.0. In another embodiment, the difference in the index of refraction between the transparent material 330 and the substrate 110 may be less than about 20%, less than about 10%, or less than about 5% of the difference in the index of refraction between the transparent material 330 and the microlenses 322.

Figure 10:
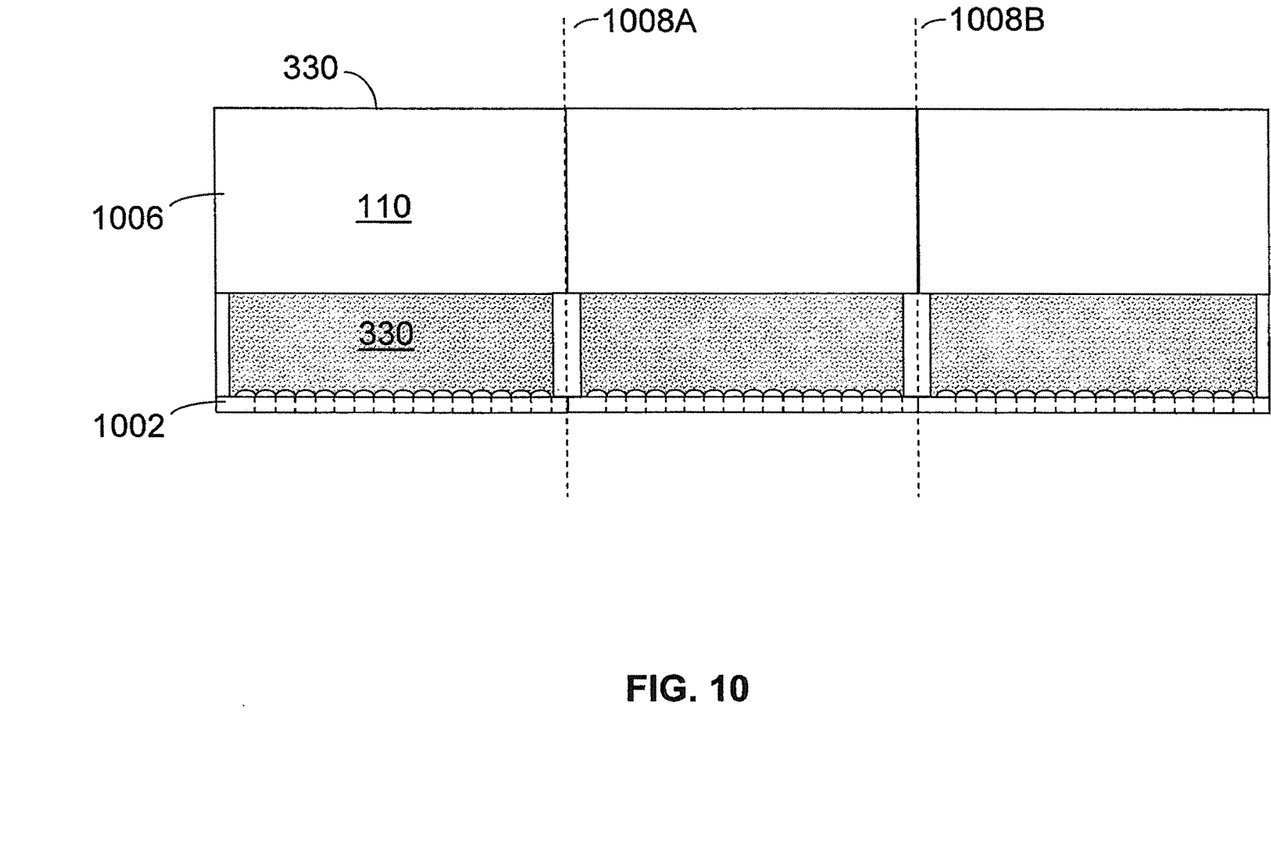
FIG. 10 shows a plurality of example imager modules according to an embodiment described herein.

As shown in FIG. 10, the imager module 300 may be manufactured by forming a first wafer 1002 containing a plurality of imager dies 1004, forming a second wafer 1006 containing a plurality of lens structures having substrates 110 and then coupling the first 1002 and second wafers 1006 with the transparent material 330 between them. The joined wafers may then be divided along lines 1008A and 1008B into a plurality of imager modules 330.

Figure 4:
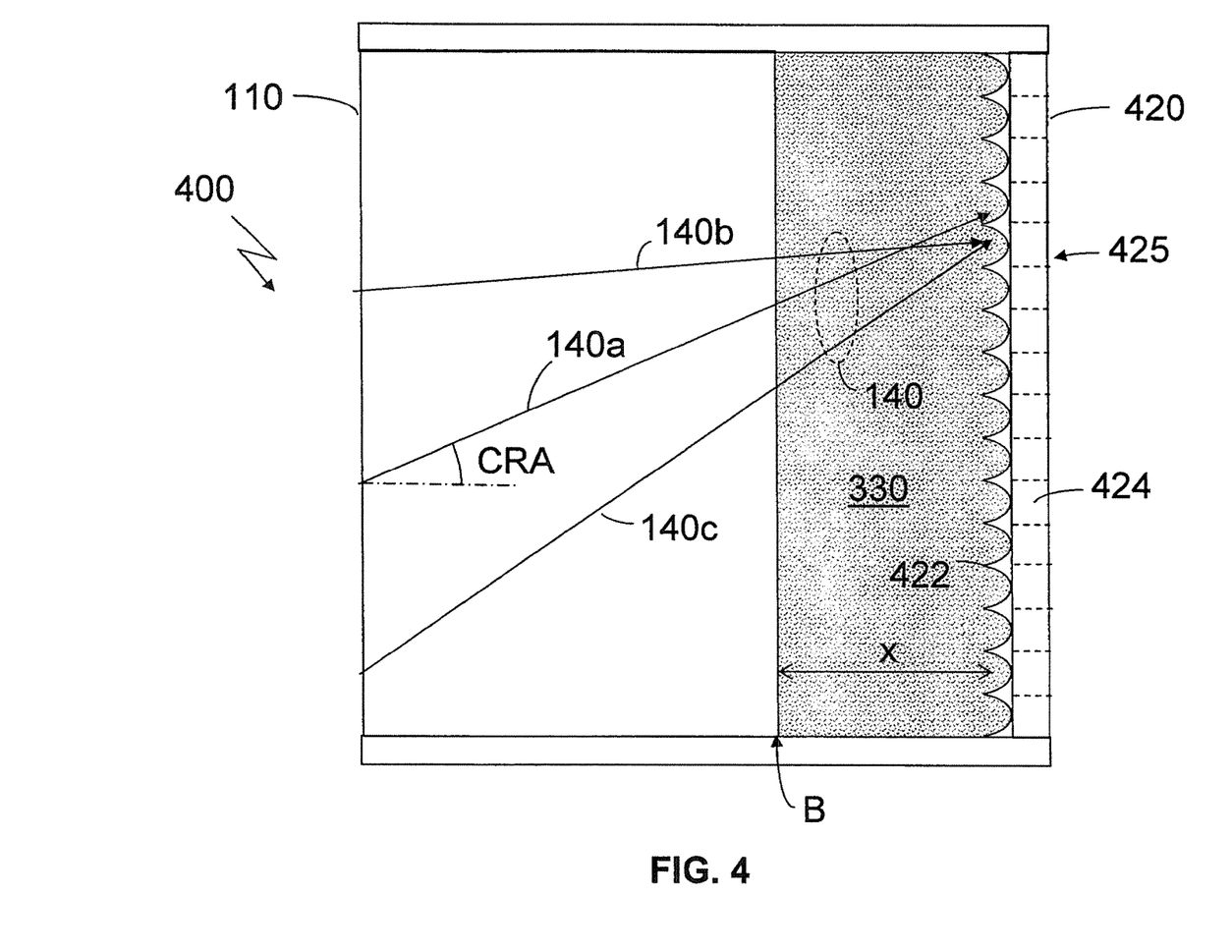
FIG. 4 shows an example imager module and a bundle of light rays according to an embodiment described herein.

FIG. 4 is a diagram of a portion of an imager module 400 having a substrate 110 and a pixel array 420, which is part of an imager die. The substrate 110 is spaced at a distance x from the pixel array 420. The pixel array 420 includes a plurality of concave microlenses 422 arranged above a respective pixel cell 424 that focus the incoming light onto the photosensor of each pixel cell 424.

Similar to the imager module 300 of FIG. 3, the imager module of FIG. 4 includes a transparent material 330 having an index of refraction that is close to or the same as the index of refraction of the substrate 110. The microlenses 422 of FIG. 4 are concave lenses and have a lower index of refraction than that of the transparent material 330 in order to focus the incoming light 140 onto the photosensors and enhance the fill factor of the pixel cells 424. The difference in the index of refraction of the transparent material 330 and the index of refraction of the microlenses 422 may be at or about 0.5 or greater. In one embodiment, the index of refraction of the transparent material 330 may be at or about 1.5 and the index of refraction of the microlenses 422 may be at or about 1.0.

The imager modules 300, 400 may also include a color filter array for allowing only light of a particular color to reach certain photosensors of the pixel cells 324, 424. The color filter array may, for example, include color filters arranged in a Bayer pattern or other patterns to allow red, green, and blue light or yellow, cyan, and magenta light to reach the respective photosensors, as is known in the art.

Figure 5:
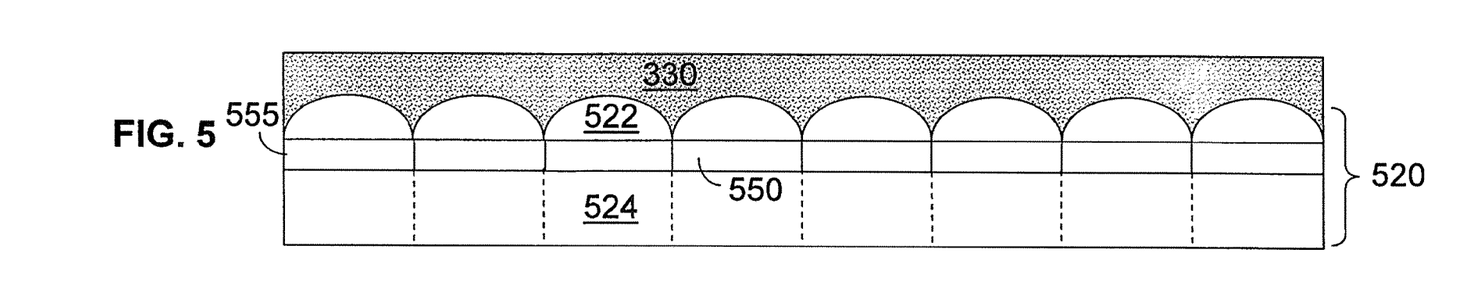
FIG. 5 shows an example pixel array having a microlens array and color filter array according to an embodiment described herein.
Figure 6:
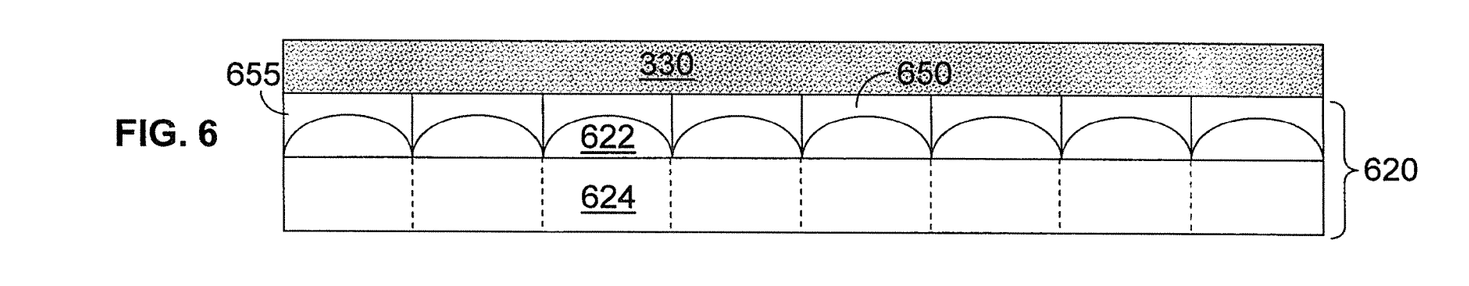
FIG. 6 shows an example pixel array having a microlens array and color filter array according to an embodiment described herein.
Figure 7:
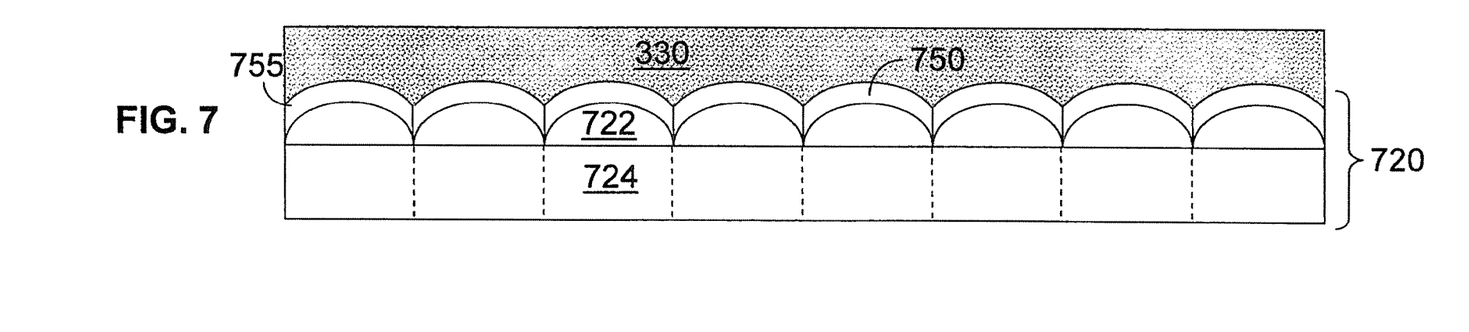
FIG. 7 shows an example pixel array having a microlens array and color filter array according to an embodiment described herein.

FIG. 5 shows a pixel array 520 in which the pixel cells 524 includes a color filter array 555 made up of a plurality of filters 550. arranged below the microlenses 522. In various embodiments, the microlenses 522 may be formed of materials that require a relatively high deposition temperature during the microlens 522 forming process, such as chemical vapor deposition, which may cause degradation of the color filter array 555. To avoid degradation of the color filter array 555, the color filter array 555 may be formed on top of the microlenses so that the color filter array 555 is subjected to lower processing temperatures. FIG. 6 shows a pixel array 620 in which each pixel cell 624 includes a planarized color filter array 655 formed of a plurality of color filters 650 respectively arranged over the microlenses 622. FIG. 7 shows a pixel array 720 in which each pixel cell 724 includes a conformal color filter array 755 including a plurality of color filters 750 respectively arranged over the microlenses 722. The embodiments shown in FIGS. 6 and 7 include the transparent material 330 as described above arranged between the substrate and the color filters 655, 755, while the embodiment shown in FIG. 5 includes the transparent material 330 arranged between the substrate and the microlenses 522. The color filters 655, 755 have similar or the same refractive indexes as the transparent material 330.

Figure 8:
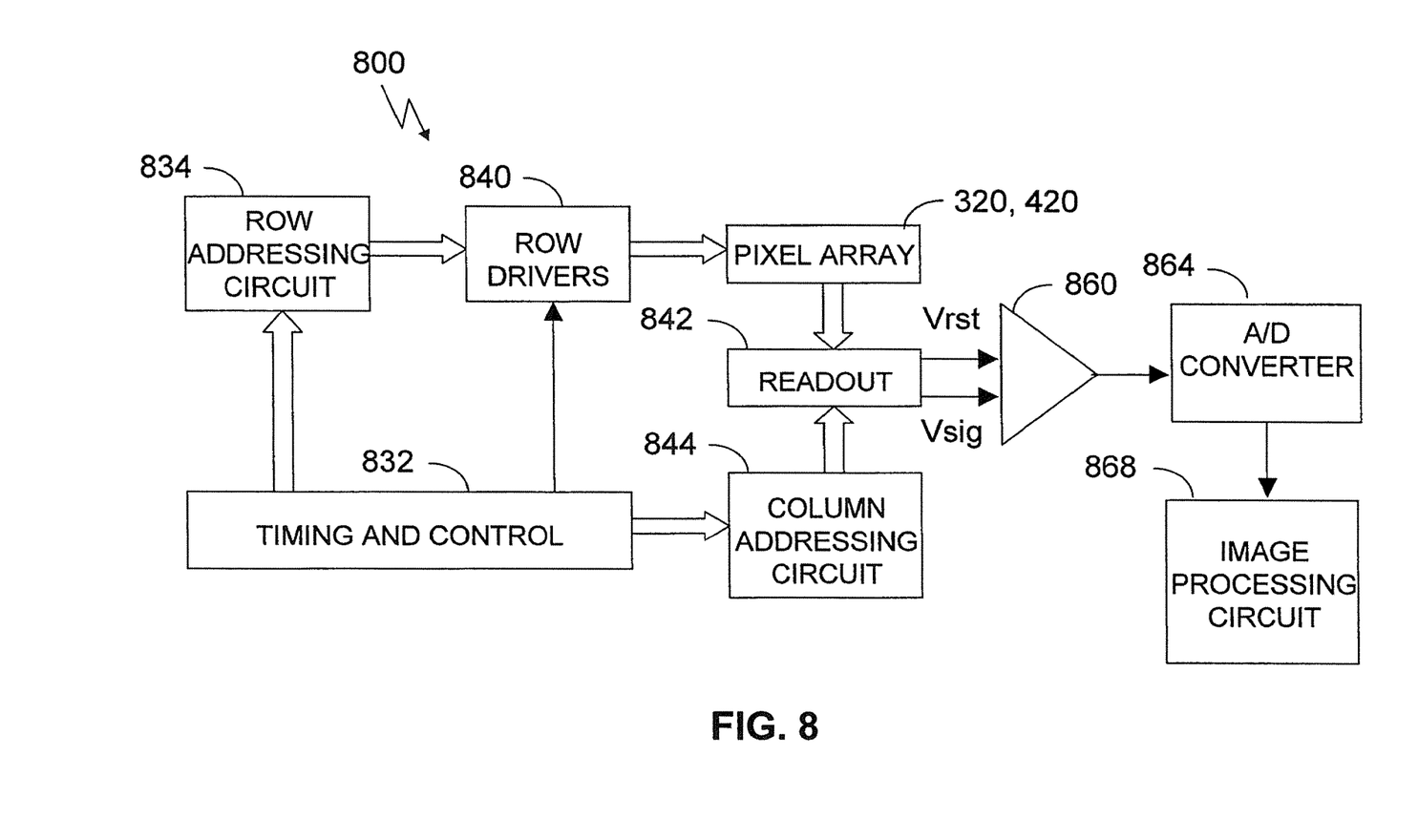
FIG. 8 illustrates a block diagram of a CMOS imaging device constructed in accordance with an embodiment described herein.

FIG. 8 shows a block diagram of an imaging device 800, e.g. a CMOS imager, that may be used in conjunction with an imager module 300, 400 according to embodiments described herein. A timing and control circuit 832 provides timing and control signals for enabling the reading out of signals from pixels of the pixel array 320, 420 in a manner commonly known to those skilled in the art. The pixel array 320, 420 has dimensions of M rows by N columns of pixels, with the size of the pixel array 320, 420 depending on a particular application.

Signals from the imaging device 800 are typically read out a row at a time using a column parallel readout architecture. The timing and control circuit 832 selects a particular row of pixels in the pixel array 320, 420 by controlling the operation of a row addressing circuit 834 and row drivers 840. Signals stored in the selected row of pixels are provided to a readout circuit 842. The signals are read from each of the columns of the array sequentially or in parallel using a column addressing circuit 844. The pixel signals, which include a pixel reset signal Vrst and image pixel signal Vsig, are provided as outputs of the readout circuit 842, and are typically subtracted in a differential amplifier 860 and the result digitized by an analog to digital converter 864 to provide a digital pixel signal. The digital pixel signals represent an image captured by pixel array 320, 420 and are processed in an image processing circuit 868 to provide an output image.

Figure 9:
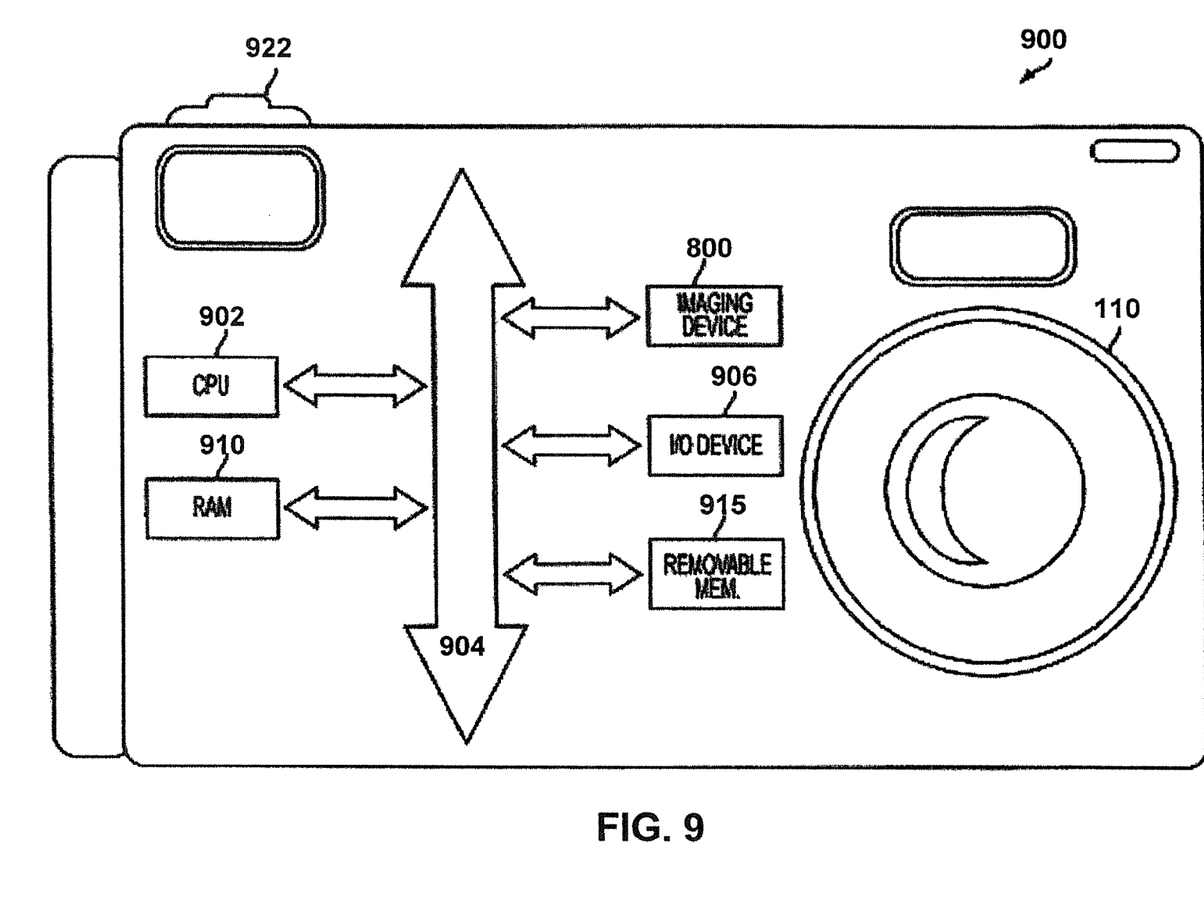
FIG. 9 depicts a system constructed in accordance with an embodiment described herein.

FIG. 9 shows a system 900 that includes an imaging device 800 having an imager module 300, 400 constructed and operated in accordance with the various embodiments described above. The system 900 is a system having digital circuits that include imaging device 800. Without being limiting, such a system could include a computer system, camera system, e.g., a camera system incorporated into an electronic device, such as a cell phone, scanner, machine vision, vehicle navigation, video phone, surveillance system, auto focus system, star tracker system, motion detection system, image stabilization system, or other image acquisition system.

System 900, e.g., a digital still or video camera system, generally comprises a central processing unit (CPU) 902, such as a control circuit or microprocessor for conducting camera functions, that communicates with one or more input/output (I/O) devices 906 over a bus 904. Imaging device 800 also communicates with the CPU 902 over the bus 904. The processor system 900 also includes random access memory (RAM) 910, and can include removable memory 915, such as flash memory, which also communicates with the CPU 902 over the bus 904. The imaging device 800 may be combined with the CPU processor with or without memory storage on a single integrated circuit or on a different chip than the CPU processor. In a camera system, a substrate 110 included with an imager module 300, 400 according to various embodiments described herein may be used to focus image light onto the pixel array 320, 420 of the imaging device 800 and an image is captured when a shutter release button 922 is pressed.

While embodiments have been described in detail in connection with the embodiments known at the time, it should be readily understood that the claimed invention is not limited to the disclosed embodiments. Rather, the embodiments can be modified to incorporate any number of variations, alterations, substitutions or equivalent arrangements not heretofore described. For example, while some embodiments are described in connection with a CMOS pixel imaging device, they can be practiced with any other type of imaging device (e.g., CCD, etc.) employing a pixel cell.

The invention claimed is:

1. An imaging structure, comprising:
a wafer-level focusing lens structure;
a pixel array for capturing an image focused by the focusing lens structure, wherein the pixel array comprises a plurality of dry-etched microlenses adhered to the wafer-level focusing lens structure;
a transparent material arranged between the focusing lens structure and the pixel array, wherein the transparent material comprises a thermal curable adhesive configured to adhere the plurality of microlenses to the wafer-level focusing lens structure, wherein the focusing lens structure has a first index of refraction at an interface with the transparent material, wherein the transparent material has a second index of refraction that is substantially the same as the first index of refraction, and wherein the second index of refraction is between about 1.38 and 1.45; and
a color filter array, wherein the color filter array is arranged above the plurality of microlenses and comprises a planar top surface and a bottom surface shaped conformally to the plurality of microlenses, wherein the planar top surface is adjacent to the transparent material, and wherein the transparent material is adjacent to the wafer-level focusing lens structure.

2. The imaging structure of claim 1, wherein the plurality of microlenses has a third index of refraction that is different from the second index of refraction by about 0.5 or more.

3. The imaging structure of claim 2, wherein the third index of refraction is greater than the second index of refraction by about 0.5 or more.

4. The imaging structure of claim 3, wherein the plurality of microlenses are convex microlenses.

5. The imaging structure of claim 2, wherein the third index of refraction is less than the second index of refraction by about 0.5 or more.

6. The imaging structure of claim 5, wherein the plurality of microlenses are concave microlenses.

7. The imaging structure of claim 1, wherein the microlenses have a third index of refraction, and wherein the third index of refraction is about 2.0.

8. The imaging structure of claim 1, wherein the plurality of microlenses is formed of a material selected from the group consisting of silicon nitride, silicon oxynitrides, carbon, and titanium oxide.

9. The imaging structure of claim 1, wherein the pixel array further comprises a plurality of photosensors.

10. The imaging structure of claim 1, wherein the second index of refraction is less than 20% different from the first index of refraction.

11. The imaging structure of claim 1, wherein the second index of refraction is less than 5% different from the first index of refraction.

12. A camera system employing the imaging structure of claim 1.

13. An imaging module, comprising:
an imager die comprising a plurality of pixel cells, a plurality of dry-etched microlenses arranged over the pixel cells, and a color filter array arranged over the microlenses, wherein the color filter array comprises a planar top surface and a bottom surface shaped conformally to the plurality of microlenses;
a wafer-level focusing lens structure adhered to the plurality of microlenses and configured to focus an image onto the imager die, the focusing lens structure comprising a substrate; and
a transparent material arranged between the substrate and the imager die, the transparent material having an index of refraction that is substantially the same as an index of refraction of the wafer-level focusing lens structure, wherein the planar top surface of the color filter array is adjacent to the transparent material, wherein the transparent material is adjacent to the wafer-level focusing lens structure, wherein the transparent material comprises a thermal curable adhesive configured to adhere the wafer-level focusing lens structure to the plurality of microlenses, and wherein the index of refraction of the wafer-level focusing lens structure is between about 1.38 and 1.45.

14. The imaging module of claim 13, wherein the plurality of microlenses are convex and have an index of refraction that is about 0.5 or greater than the index of refraction of the transparent material.

15. The imaging module of claim 13, wherein the plurality of microlenses are concave and have an index of refraction that is about 0.5 or less than the index of refraction of the transparent material.

16. A method of forming an imager module, comprising:

providing a first wafer, wherein providing the first wafer comprises forming a microlens array above an array of pixel cells and forming a color filter array above the microlens array, wherein the color filter array has a planar top surface and a bottom surface shaped conformally to the microlens array;

applying a transparent material between the first wafer containing a plurality of imager dies and a second wafer containing a plurality of wafer-level lens structures, the transparent material having an index of refraction that is less than 20% different from an index of refraction of the plurality of wafer-level lens structures, wherein the planar top surface of the color filter array is adjacent to the transparent material and wherein the transparent material is adjacent to the plurality of wafer-level lens structures;

coupling the first wafer to the second wafer; and dividing the structure into a plurality of imager modules, each module comprising an imager die, a wafer-level lens structure, and a transparent material.

17. The method of claim 16, wherein the transparent material is an adhesive that couples the first wafer to the second wafer.

18. The method of claim 16, wherein the first wafer comprises a microlens array, and wherein microlenses of the microlens array have an index of refraction that is at least 0.5 different from an index of refraction of the transparent material.

19. The method of claim 18, wherein the index of refraction of the transparent material is less than 5% different from the index of refraction of the plurality of lens structures.

* * * * *